United States Patent [19]

Kogan

[11] Patent Number: 4,897,816
[45] Date of Patent: Jan. 30, 1990

[54] SERIAL DYNAMIC MEMORY SHIFT REGISTER

[75] Inventor: Grigory Kogan, Portland, Oreg.
[73] Assignee: Tektronix, Inc., Beaverton, Oreg.
[21] Appl. No.: 332,128
[22] Filed: Apr. 3, 1989
[51] Int. Cl.[4] .............................................. G11C 13/00
[52] U.S. Cl. .......................... 365/189.12; 365/189.05; 365/221; 365/230.08
[58] Field of Search .............. 365/221, 189.05, 189.12, 365/230.06, 230.08

[56] References Cited

U.S. PATENT DOCUMENTS 4,800,530  1/1989  Itoh et al. ........................ 365/189.12

Primary Examiner—Terrell W. Fears
Attorney, Agent, or Firm—Francis I. Gray

[57] ABSTRACT

A serial dynamic memory shift register is configured in the form of an array of dynamic memory cells. Each dynamic memory cell is coupled to a column data bus and is addressed by an individual row command, and the data from the dynamic memory cells are transferred serially from the cells via a temporary latch. The dynamic memory cells and the temporary latch form a subarray, and a plurality of subarrays connected in series form a one-bit slice. A plurality of one-bit slices connected in parallel to receive the multiple bits of a data word in parallel forms a one-word slice. Each one-word slice has an data input latch to transfer data from an input data bus to the one-word slice, and an data output latch to transfer data from the one-word slice to an output data bus. A plurality of one-word slices connected in parallel complete the serial dynamic memory shift register, with one-half of the one-word slices being anti-phase with the other half of the one-word slices to provide a continuous input/output flow of data. Data words are read sequentially into the one-word slices, shifted serially along each one-word slice, and then read sequentially out of the one-word slices to perform the shift process at the clock rate.

4 Claims, 4 Drawing Sheets

SERIAL DYNAMIC MEMORY SHIFT REGISTER

BACKGROUND OF THE INVENTION

The present invention relates to digital data processing, and more particularly to a serial dynamic memory shift register having an array configuration of dynamic memory cells that performs data shift operations with significantly fewer transistors than a conventional shift register.

The cell of a conventional shift register has a transfer device followed by an inverter followed by another transfer device followed by another inverter for a total of six to eight transistors per cell. Data is input to the first transfer device that is enabled by a first clock signal to pass the data to the first inverter. The output of the first inverter is clocked through the second transfer device by a second clock signal to the second inverter, the data being output from the second inverter delayed by one clock cycle where the two clock signals are opposite phases of a master clock signal. When the integration of several large shift registers on a single chip is required, this type of shift register cell is not economical. For instance the size of each shift register may be ten bits wide and one thousand bits long. If four of such registers are required on a single chip, the total number of transistors could exceed 320,000.

What is desired is a shift register that reduces the total number of transistors for a given size without a reduction in processing speed.

SUMMARY OF THE INVENTION

Accordingly the present invention provides a serial dynamic memory shift register having an array of dynamic memory cells with only two transistors per cell. Dynamic memory cells are connected in subarrays, each cell being driven by an individual row command and being coupled to a single column data bus, and each subarray has a temporary latch to interface it with a subsequent subarray in series. Each series of subarrays forms a one-bit slice. A plurality of such one-bit slices in parallel form a one-word slice. A data input latch and a data output latch are coupled to the beginning and end, respectively, of each one-word slice to couple parallel data into and out of each one-word slice one data word at a time. A plurality of one-word slices are connected in parallel to complete the dynamic memory shift register for processing data in parallel, serial data words being read sequentially into the one-word slices, being shifted serially through each one-word slice, and then being read sequentially out of the one-word slices.

The objects, advantages and other novel features of the present invention are apparent from the following detailed description when read in conjunction with the appended claims and attached drawing.

DESCRIPTION OF THE PREFERRED EMBODIMENT

Figure 1:
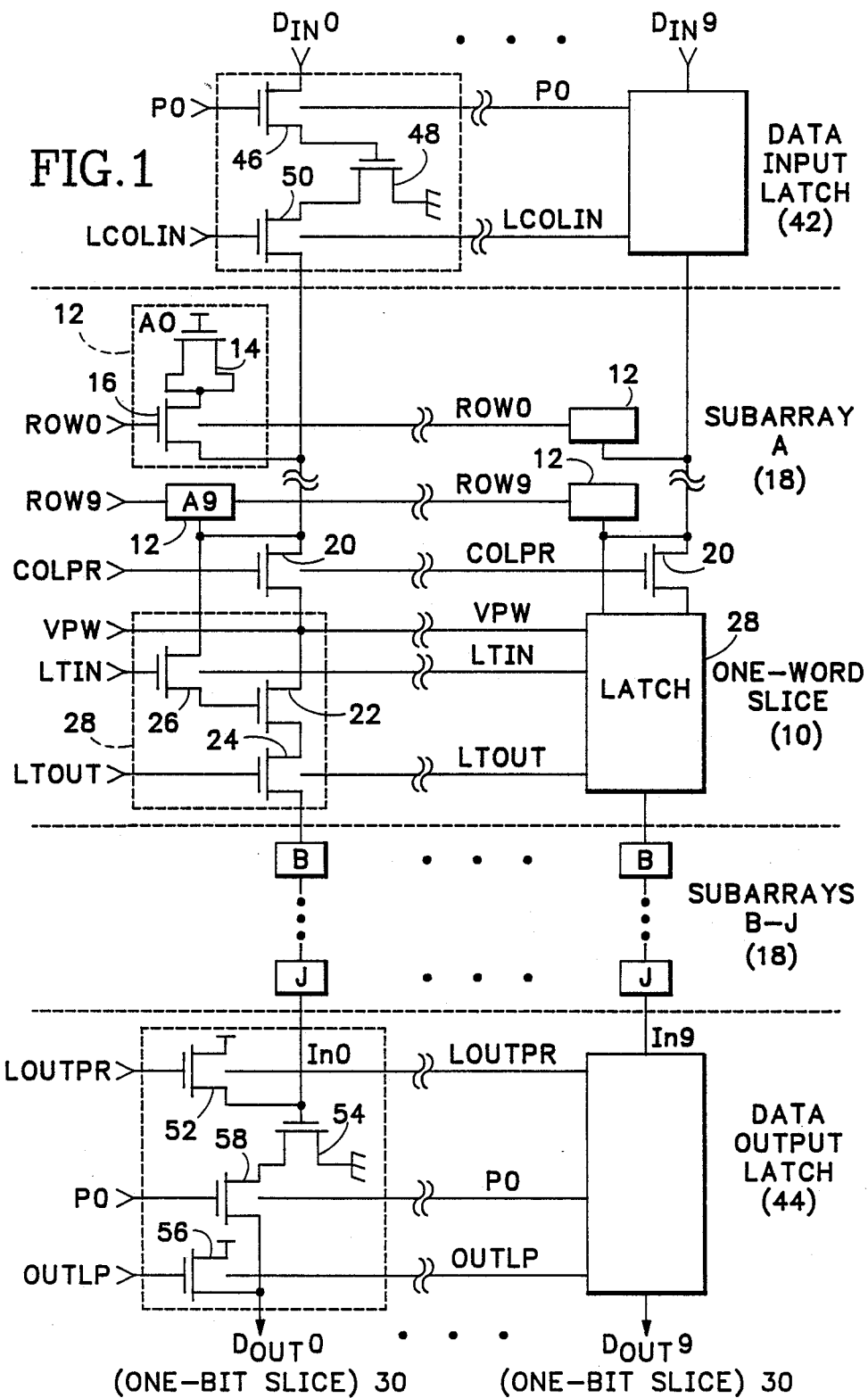
FIG. 1 is a schematic diagram of a one-word slice made up of a plurality of one-bit slice serial dynamic memory subarrays according to the present invention.

Referring now to FIG. 1 a conventional dynamic memory cell 12 has a first transistor 14 with its gate coupled to a voltage rail and its source and drain connected together. The first transistor 14 acts as a capacitor to store a charge in the form of a high voltage level or a low voltage level, the charge voltage level representing the value of a binary data bit. A second transistor 16 has its drain coupled to the drain of the first transistor 14, its gate coupled to receive a row command, and its source coupled to a column data bus. When a row command is applied to the second transistor 16, the first transistor 14 is coupled to the column data bus so that charge sharing between the first transistor and the column data bus either pulls up or pulls down the voltage on the column data bus depending upon whether the data value on the column data bus represents a digital one or zero.

A plurality of dynamic memory cells 12 are connected to the column data bus, each having an individual row command, to form a subarray 18 of serial dynamic memory cells. At the end of the subarray 18 are a series of transistors 20, 22, 24 that couple the column data bus of one subarray to the column data bus of the next subarray in series. Another transistor 26 is coupled between the column data bus and the gate of the central transistor 22. Transistor 20 is a precharge transistor that charges the column data bus to a value determined by a tri-state power signal VPW applied to the junction between transistors 20, 22 in response to a column precharge command COLPR applied to its gate. The three states of the tri-state power signal VPW are a low voltage level, a high voltage level and a transistor threshold voltage level between the high and low voltage levels. The remaining transistors 22, 24, 26 form a temporary latch 28 that receives data from a dynamic memory cell 12 in the subarray 18 that is addressed by a row command at the gate of central transistor 22 in response to a latch input command LTIN applied to the gate of transistor 26. The data on the gate of central transistor 22 is then transferred to the column data bus of the next subarray 18 in series in response to a latch output command LTOUT applied to the gate of the last transistor 24. A plurality of subarrays 18 connected in series form a one-bit slice 30. A plurality of one-bit slices connected in parallel form a one-word slice 10.

Figure 2:
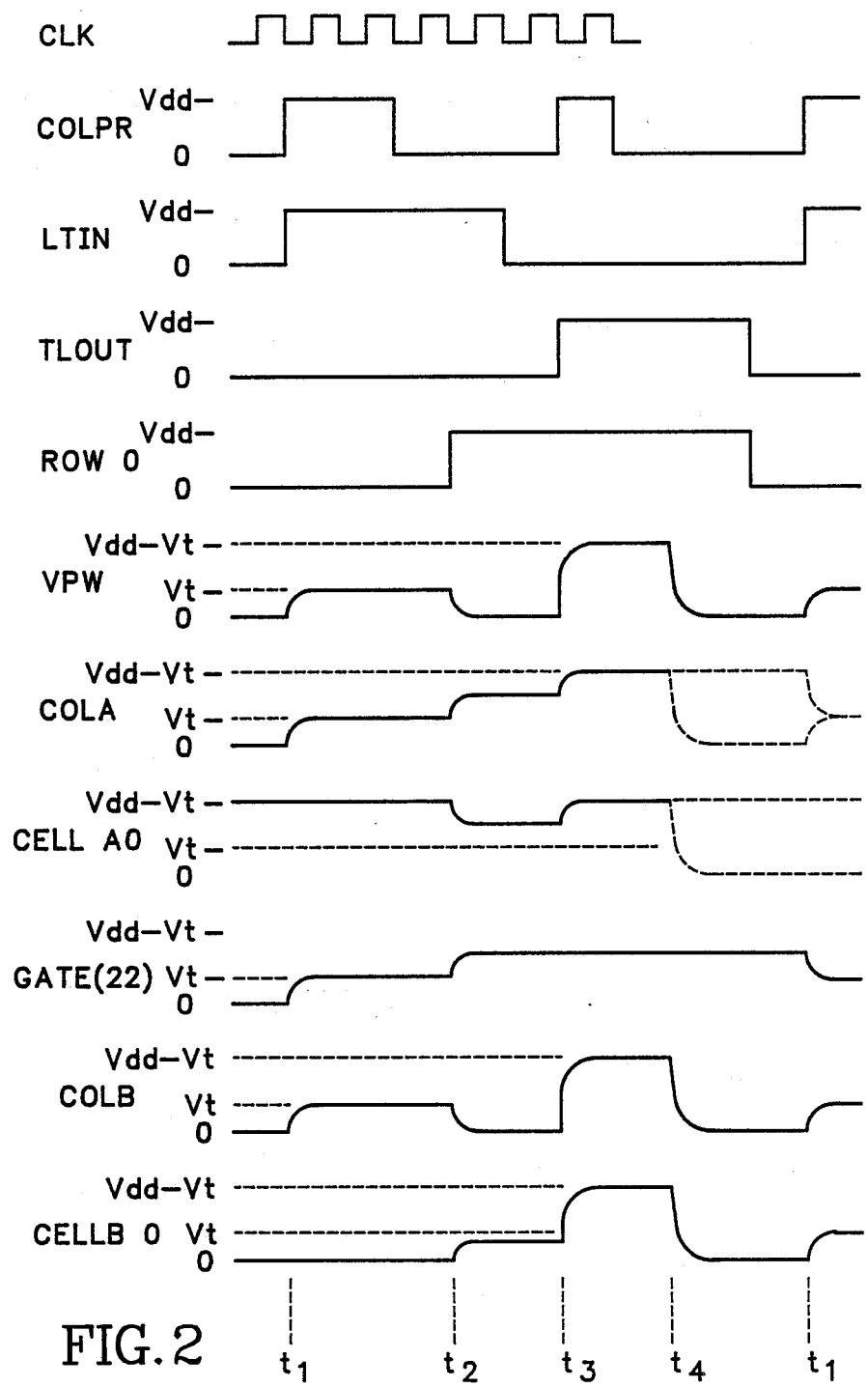
FIG. 2 is a timing diagram illustrating the serial transfer of data bits between serial subarrays according to the present invention.

In operation in order to transfer data from the first cell A0 of the first subarray A to the first cell B0 of the second subarray B in series requires two steps: (a) transfer the data from cell A0 to the temporary latch 28, and (b) transfer the data from the temporary latch to cell B0. Referring now to the timing diagram of FIG. 2 the transfer of data from cell A0 to the temporary latch 28 starts at time t1. The column precharge command COLPR is applied to the gate of transistor 20, the latch input signal LTIN is applied to the gate of transistor 26, and the tri-state power signal VPW, having a level equal to the threshold voltage Vt of a transistor, is applied to the junction of transistors 20, 22. Transistors 20, 26 conduct to transfer Vt from the junction of transistors 20, 22 to the column A data bus COLA and to the gate of transistor 22. Since these signals are applied to all the subarrays in the one-bit slice, the column B data bus also is charged to Vt. After COLPR goes to zero, at time t2 the row zero command ROW0 is applied to cell A0, coupling the capacitor (transistor 14) of cell A0 to the column data bus and VPW goes to zero. Charge sharing brings the column A data bus and the gate of central transistor 22 to above the Vt level, assuming that cell A0 has stored a high level, where "high=Vdd-Vt" and Vdd is the voltage rail. The transfer is completed when LTIN goes to zero, leaving the gate of central transistor 22 floating at above Vt level. If the cell A0 had a zero level stored, then charge sharing would pull the column A data bus and the gate of central transistor 22 to below Vt level.

Transfer from the temporary latch 28 to cell B0 in the next subarray B starts at time t3 with the charging of both column data buses, A and B, to the high level as a result of COLPR going high and VPW also going high. Cells A0 and B0 follow their respective column data buses since the ROW0 command is still high. Then COLPR is removed and VPW goes to zero at time t4. With the latch output signal LTOUT high, column B data bus discharges through transistors 22, 24 to VPW, which is at zero, since transistor 22 is biased on by the data value stored at the gate being above Vt. Cell B0 follows column B data bus to store the inverse of the value stored originally in cell A0. Transfer is completed when the ROW0 command is removed, leaving cell B0 floating at zero. If the gate of central transistor 22 is below Vt, no discharge of column B data bus takes place since transistor 22 is cut off, and cell B0 remains at the high level. Thus data flows vertically from the top to the bottom of each one-bit slice 30 simultaneously for each subarray 18 on a row by row basis.

Figure 3:
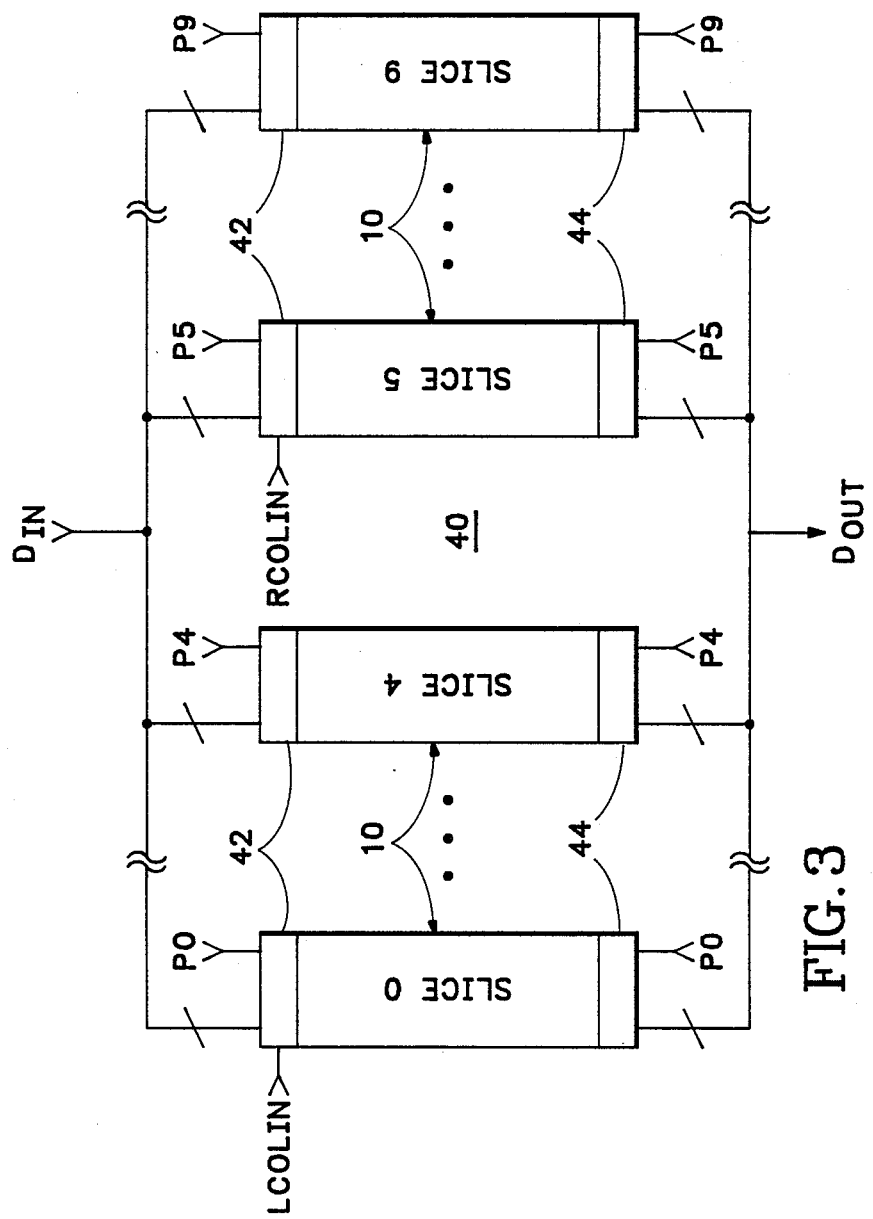
FIG. 3 is a block diagram of a serial dynamic memory shift register according to the present invention.

An array 40 of one-word slices 10 as shown in FIG. 3 is arranged in a manner to satisfy size and timing of the resulting shift register. The array 40 has two halves—left and right. Each half of the array 40 has x adjacent one-word slices 10, where x is one-half of the total number of one-word slices. For a ten-bit word x is five. Data input latch 42 and data output latch 44, driven sequentially by phases P0-P9, are added to the top and bottom, respectively, of each one-word slice 10 to sequence data words from an input data bus into each one-word slice in turn and to output sequentially data words from each one-word slice in turn onto an output data bus.

The input data latch 42, shown in detail for one of the one-bit slices 30 in FIG. 1, has an input gate transistor 46 to which the input data Din0-9 is applied. Referring to slice 0 when P0 is high, Din0-9 passes through the input gate transistor 46 to charge the gate of a storage transistor 48 to the input data value, leaving the storage transistor floating at high or low according to the value of Din0-9. A left column input signal LCOLIN is applied to the left five one-word slices 10 at transistor 50 to control data transfer from the data input latch 42 to the column data buses A0-9. The column data bus is charged to a high value at time t3 and discharges through transistors 48, 50 at time t4, if the input data value is high, to store a low value in the cell of the selected row of the subarray 18, or does not discharge, since transistor 48 is cut off if the input data value is low, to store a high value in the cell of the selected row of the subarray.

The data output latch 44 has inputs In0-9 coupled to the respective outputs of the last subarray J to receive the data from the temporary latches 28. A left output precharge LOUTPR command applied to the gate of a precharge transistor 52 charges transistor 54 to a high level before the latch output command LTOUT is applied to the temporary latch 28. At the rising edge of LTOUT, transistor 54 either discharges or stays floating at the high level depending upon the data from the temporary latch 28. An output line precharge OUTLP command is applied to a second precharge transistor 56 to charge the output lines Dout0-9 to a high level before the appropriate clock phase pulse P0 is applied to an output transistor 58. On the rising edge of the clock phase pulse Dout0-9 either discharges through transistors 54, 58 or stays floating high to transfer the data to the output bus.

Figure 4:
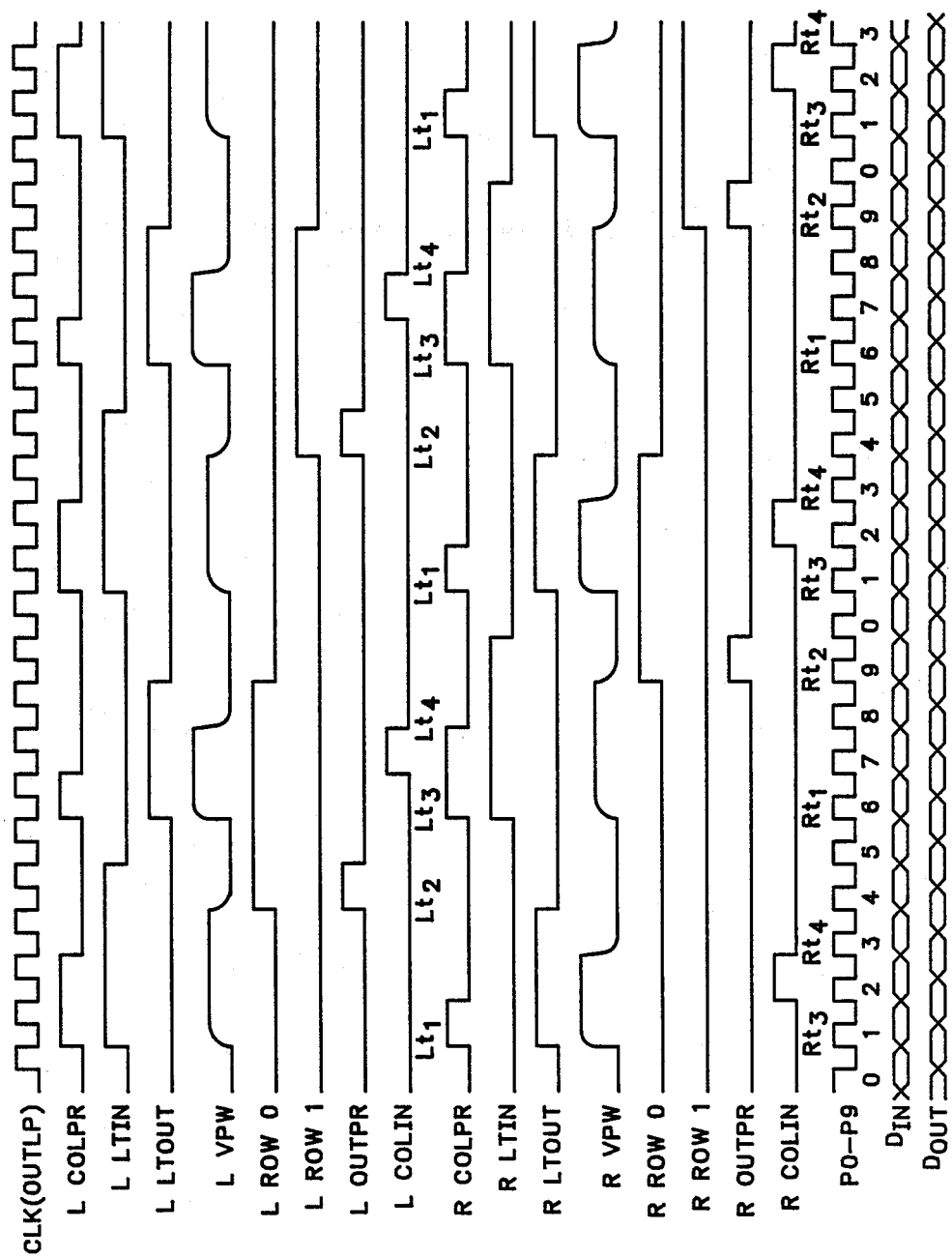
FIG. 4 is a timing diagram illustrating the transfer of data between the input and output of the serial dynamic memory shift register according to the present invention.

A complete timing for the array 40 is shown in FIG. 4. CLK is an input clock that is subdivided into ten phases P0-9. A group of signals preceded by the letter "L" drive the left half of the array 40, and a second group of signals preceded by the letter "R" drive the right half. The two groups of signals are identical except that they are shifted five clock cycles with respect to each other. Signals LCOLPR, LVPW, LLTIN, LLTOUT and LROW0-9 control data flow between subarrays 18 in the left half of the array 40 as described with respect to FIG. 2, and their right counterparts control data flow in the right half. Input data Din0-9 is valid on the rising edge of CLK, or falling edge of P0-9. Phases P0-4 fill data input latches 42 of the left half of the array 40. Then LCOLIN transfers data to the top column data buses of slices 0-4. Similarly phases P5-9 fill data input latches 42 of the right half and RCOLIN transfers data to the top column data buses of slices 5-9. This provides uninterrupted data acquisition. The left data output latches 44 are filled on the rising edge of LLTOUT, and then are serially scanned with phases P0-4. The output data Dout0-9 is valid on the rising edge of a phase. Similarly the data output latches 44 of the right half are filled on the rising edge of RLTOUT, and then serially read out during the next five clock cycles by phases P5-9.

Thus the present invention provides a serial dynamic memory shift register with an array of dynamic memory cells that provides continuous input/output data flow of data equivalent to a shift register of the same size, the dynamic memory cell having only two transistors which is significantly less than a corresponding cell of a conventional shift register.

What is claimed is:

1. A serial dynamic memory shift register comprising:
   a plurality of dynamic memory cells coupled to a column data bus having an input end to which input data is applied and an output end, each cell being coupled to the column data bus in response to an individual row command to transfer data between the cell and the column data bus; and
   a temporary latch having an input and an output, the input being coupled to the output end of the column data bus to transfer data from the column data bus to the output of the temporary latch;
   whereby the plurality of dynamic memory cells, column data bus and temporary latch form a serial subarray.

2. A serial dynamic memory shift register as recited in claim 1 further comprising a plurality of serial subarrays coupled in series to produce a one-bit slice, the output of the temporary latch of one subarray being coupled to the input end of the column data bus of the next subarray.

3. A serial dynamic memory shift register as recited in claim 2 further comprising a plurality of one-bit slices coupled in parallel to receive at the input ends of the first subarrays in each one-bit slice individual bits of a data word and to output from the outputs of the temporary latches of the last subarrays in each one-bit slice individual bits of the data word to form a one-word slice.

4. A serial dynamic memory shift register as recited in claim 3 further comprising a plurality of one-word slices coupled in parallel to sequentially receive input data words from an input data bus and to sequentially output output data words onto an output data bus, each one-word slice having a data input latch coupled between the input data bus and the input ends of the first subarrays to transfer data from the input data bus to the one-word slice and having a data output latch coupled between the output data bus and the temporary latches of the last subarrays to transfer data from the one-word slice to the output data bus.

* * * * *